(12) United States Patent
Hammes et al.

(10) Patent No.: US 7,336,717 B2
(45) Date of Patent: Feb. 26, 2008

(54) RECEIVER CIRCUIT, IN PARTICULAR FOR A MOBILE RADIO

(75) Inventors: Markus Hammes, Dinslaken (DE); Stefan Heinen, Baesweiler (DE); Stefan Van Waasen, Duisburg (DE); Andre Hanke, Düsseldorf (DE); Sönke Mehrgardt, Deisenhofen (DE); Elmar Wagner, Duisburg (DE)

(73) Assignee: Infineon Technologies AG, Munich (DE)

( * ) Notice: Subject to any disclaimer, the term of this patent is extended or adjusted under 35 U.S.C. 154(b) by 841 days.

(21) Appl. No.: 10/384,996

(22) Filed: Mar. 10, 2003

(65) Prior Publication Data

US 2003/0156669 A1    Aug. 21, 2003

Related U.S. Application Data

(63) Continuation of application No. PCT/DE01/03425, filed on Sep. 6, 2001.

(30) Foreign Application Priority Data

Sep. 8, 2000    (DE)    ................................. 100 44 449

(51) Int. Cl.
  *H04L 5/12*    (2006.01)
  *H04L 23/02*   (2006.01)

(52) U.S. Cl. ...................... 375/261; 375/279; 375/329; 375/322; 329/304

(58) Field of Classification Search ................ 375/350, 375/346, 348, 222, 322, 329, 261, 279; 455/302, 455/296, 307; 329/304
See application file for complete search history.

(56) References Cited

U.S. PATENT DOCUMENTS 5,376,894 A    12/1994  Petranovich
5,440,587 A  *  8/1995  Ishikawa et al. ............ 375/332

(Continued)

FOREIGN PATENT DOCUMENTS

DE          26 36 268 A1    2/1977

(Continued)

OTHER PUBLICATIONS

Yoon, C. G. et al.: "Digital Logic Implementation of the Quadricorrelators for Frequency Detector", Proceedings of the 37th Midwest Symposium on Circuits and Systems Aug. 3-5, 1994, IEEE, vol. 2, 1995, pp. 757-760.

(Continued)

*Primary Examiner*—Phuong Phu
(74) *Attorney, Agent, or Firm*—Laurence A. Greenberg; Werner H. Stemer; Ralph E. Locher

(57) ABSTRACT

A radio receiver with a low intermediate frequency has a first mixer stage that can be fed with a modulated input signal and at whose output a complex intermediate frequency signal can be derived. Connected downstream of the first mixer stage is a limiting amplifier at whose output the intermediate frequency signal is present in a discrete-value and continuous-time fashion. A sampling device, for sampling the intermediate frequency signal, and a digital demodulator unit are connected to the output of this limiter. The demodulated input signal can be derived at the output of this digital demodulator unit. The present radio receiver requires a low chip area in conjunction with low power consumption, but offers a high sensitivity and accuracy based on the digitally implemented demodulation.

11 Claims, 2 Drawing Sheets

U.S. PATENT DOCUMENTS

| | | | |
|---|---|---|---|
| 5,521,548 A | 5/1996 | Sugawara | |
| 5,539,776 A | 7/1996 | Subramanian | |
| 5,548,831 A | 8/1996 | Bijker et al. | |
| 5,610,948 A * | 3/1997 | Ninomiya et al. | 375/324 |
| 5,625,652 A | 4/1997 | Petranovich | |
| 5,661,433 A | 8/1997 | LaRosa et al. | |
| 5,703,910 A * | 12/1997 | Durvaux et al. | 375/322 |
| 5,715,529 A | 2/1998 | Kianush et al. | |
| 5,724,001 A | 3/1998 | Chang | |
| 5,757,867 A | 5/1998 | Caulfield et al. | |
| 5,812,927 A * | 9/1998 | Ben-Efraim et al. | 725/70 |
| 5,872,815 A | 2/1999 | Strolle et al. | |
| 6,308,057 B1 | 10/2001 | Hayashi | |
| 6,778,594 B1 * | 8/2004 | Liu | 375/222 |

FOREIGN PATENT DOCUMENTS

| | | |
|---|---|---|
| DE | 38 51 440 T2 | 10/1990 |
| DE | 40 06 654 A1 | 9/1991 |
| DE | 198 10 558 A1 | 9/1999 |
| EP | 0 394 257 B1 | 10/1990 |
| EP | 0 797 292 A1 | 9/1997 |
| EP | 0 948 128 A1 | 10/1999 |
| GB | 2 309 345 A | 7/1997 |
| JP | 6-77853 | 3/1994 |
| JP | 8-505499 | 6/1996 |
| JP | 9-83582 | 3/1997 |
| JP | 10-209904 | 8/1998 |
| JP | 11-205403 | 7/1999 |
| WO | 00/22735 | 4/2000 |

OTHER PUBLICATIONS

Subramanian, R. et al.: "Design and Implementation of All-Digital Receivers for Mobile Communications", Mobile Techn. for the Human Race, 46$^{th}$ Vehicular Techn. Conf., IEEE, vol. 2, 1996, pp. 1043-1047.

Hsu, I. et al.: "A 70-MHz Continuous-Time CMOS Band-Pass ΣΔ Modulator for GSM Receivers", Int. Symposium on Circuits and Systems., May 28-31, 2000, IEEE, vol. 2, 2000, pp. III-750-III-753.

Minnis, B. J. et al.: "A Low-IF, Polyphase Receiver for DECT", Inter. Symposium on Circuits and Systems May 28-31, 2000 Geneva Switzerland, IEEE, 2000, pp. I-60-I-63.

* cited by examiner

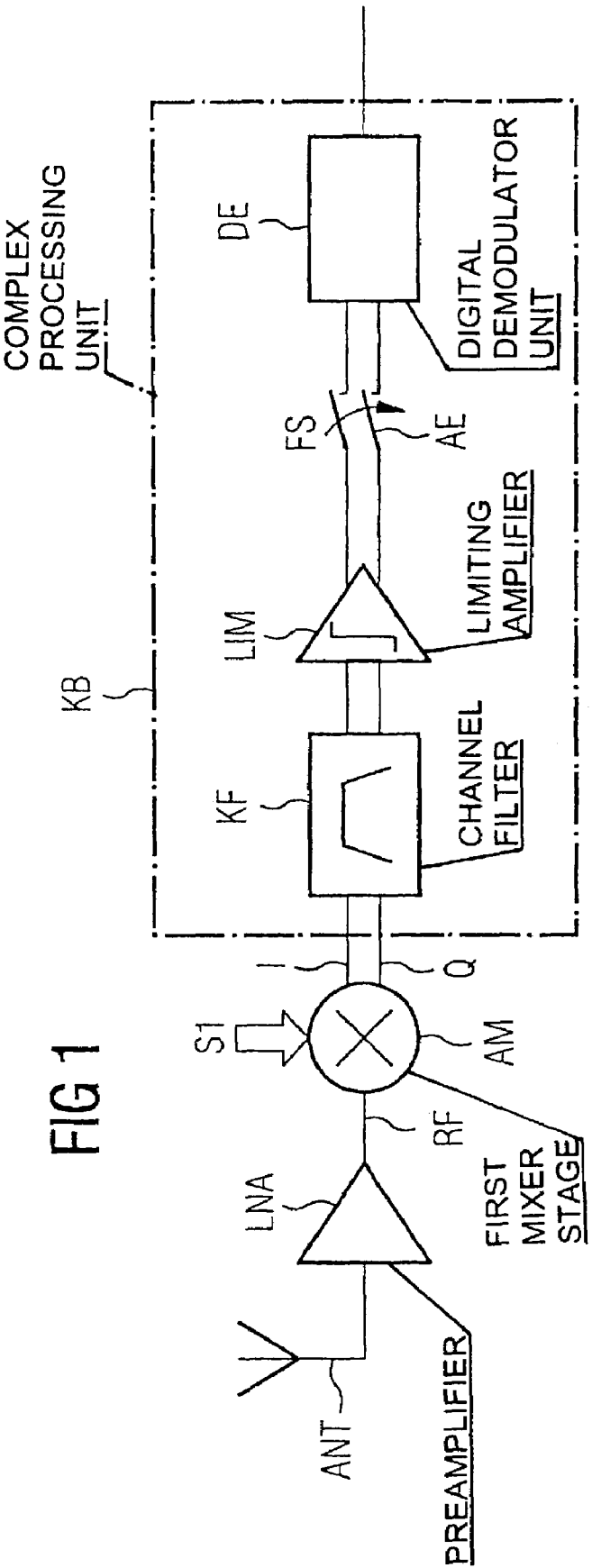

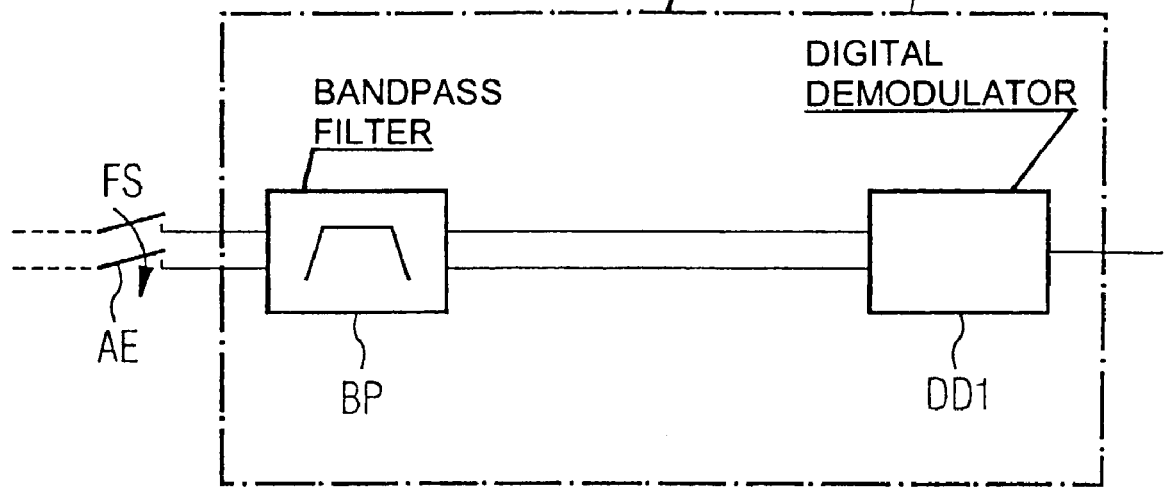
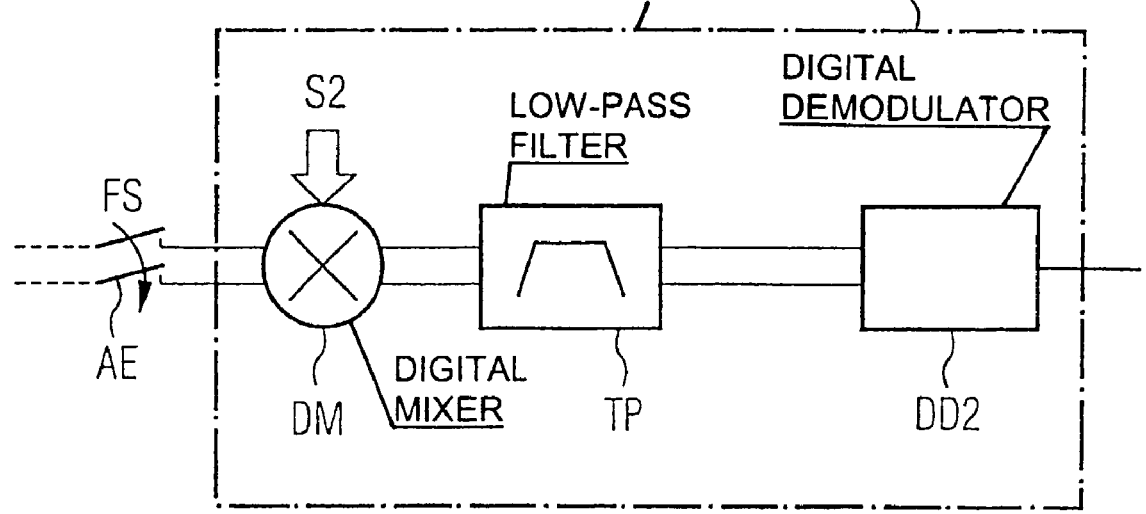

RECEIVER CIRCUIT, IN PARTICULAR FOR A MOBILE RADIO

CROSS-REFERENCE TO RELATED APPLICATION

This application is a continuation of copending International Application No. PCT/DE01/03425, filed Sep. 6, 2001, which designated the United States and was not published in English.

BACKGROUND OF THE INVENTION

Field of the Invention

Superheterodyne receiving architectures are normally used in mobile radio applications and cordless telephones for the purpose of receiving radio-frequency, modulated signals. These architectures have a relatively high intermediate frequency level. However, the superheterodyne architecture disadvantageously requires a large area and has relatively poor possibilities of integration.

In order to improve the monolithic integration of mobile radio receivers, there is a trend toward radio receivers with a low intermediate frequency or an intermediate frequency of zero.

For example, a radio receiver for the DECT (Digital Enhanced Cordless Telecommunication) standard is known from the paper entitled "A Low-IF, Polyphase Receiver for DECT, B. J. Minnis et al, IEEE International Symposium on Circuits and Systems, May 28-31, 2000, Geneva, Switzerland". This standard has an intermediate frequency of 864 kHz. Such receiver architectures of analog design have the disadvantage, however, that the analog components required for implementing the receiver circuits are strongly affected by tolerances because of temperature influences and manufacturing variances. A desired, high sensitivity of the mobile radio receiver is therefore not possible, or is possible only with a large outlay.

Furthermore, receiver architectures are known that, at the intermediate frequency level, use analog-to-digital converters downstream of the receiver front end in order to permit further digital processing of the received signals. High demands are placed on these analog-to-digital converters with respect to resolution and precision, and so these have a large chip area requirement and a high power consumption. However, these disadvantages run counter to the requirements in a mobile radio for even smaller dimensions, lower weight, and a longer battery lifetime.

A PSK (Phase Shift Keying) receiver with a heterodyne architecture is specified in U.S. Pat. No. 5,376,894. This receiver has a multistage down-mixer, downstream of which a limiter, a sampling device and a demodulator are connected.

SUMMARY OF THE INVENTION

It is accordingly an object of the invention to provide a receiver circuit, which overcomes the above-mentioned disadvantages of the prior art apparatus and methods of this general type.

In particular, it is an object of the invention to provide a receiver circuit for a mobile radio, which can be constructed to have low power consumption in conjunction with requiring a low chip area and having a high sensitivity.

With the foregoing and other objects in view there is provided, in accordance with the invention, a receiver circuit for demodulating a radio-frequency signal. The receiver circuit includes a first mixer stage having a first input, a second input, and an output. The first input is for obtaining a radio-frequency signal to be demodulated. The second input is for obtaining a complex-value carrier signal. The output is for providing a complex-valued intermediate frequency signal. The receiver circuit also includes: a limiting amplifier connected to the output of the first mixer stage, the limiting amplifier having an output for providing a discrete-value signal derived from the intermediate frequency signal; a sampling device connected to the output of the limiting amplifier; a channel filter designed as a polyphase filter configured between the first mixer stage and the limiting amplifier; and a digital demodulator unit connected downstream of the sampling device. The demodulator unit has an output for providing a demodulated signal.

In accordance with an added feature of the invention, the intermediate frequency signal has a frequency of less than or equal to 20 MHz.

In accordance with an additional feature of the invention, the digital demodulator unit has a bandpass filter and a digital demodulator connected downstream from the bandpass filter.

In accordance with another feature of the invention, the bandpass filter is a polyphase filter.

In accordance with a further feature of the invention, the digital demodulator is a quadricorrelator.

In accordance with a further added feature of the invention, the digital demodulator unit has a digital mixer stage, a lowpass filter, and digital demodulator. The lowpass filter and the digital demodulator are connected downstream from the digital mixer stage.

In accordance with yet an added feature of the invention, a low-noise preamplifier is provided for connecting the first input of the first mixer stage to an antenna.

Situated on the output side at the limiting amplifier (Limiter) is the input signal, which is decomposed into its quadrature components, as a discrete-value, but continuous time signal. The limiting amplifier assigns the signal logic states, for example 0 or 1. In the following digital demodulator, the discrete-value, continuous-time input signal is demodulated such that a discrete-time and discrete-value signal is present at the output of the digital demodulator. In this case, a sampling device that samples the input signal at a sampling frequency is provided for the purpose of time discretization.

The input signal can be an FSK (frequency shift keying) or GMSK (Gaussian minimum shift keying) modulated signal.

The receiver circuit has the advantage that it is of simple construction, can be implemented with a low chip area requirement and can be operated in an energy-saving fashion. Moreover, the receiver circuit with digital demodulation has a high sensitivity and low tolerances.

The first mixer stage, which down mixes the radio-frequency input signal into an intermediate frequency signal, can have ring mixers or active, doubly balanced mixers for this purpose. The first mixer stage can have one mixer each for the inphase and the quadrature components. It is possible to feed the carrier signal unchanged to the in phase mixer and shifted inphase by 90° to the quadrature component mixer.

In accordance with the present principle, a channel filter designed as a polyphase filter is connected between the first mixer stage and the limiting amplifier.

It is advantageously possible thereby to dispense with bandpass filters upstream of the first mixer, which is designed as a down-converter, for the purpose of channel selection. In addition, because of the complex-value signal processing, the present arrangement has a higher accuracy because more interpolation points are available for signal interpolation.

In an advantageous embodiment of the present invention, the carrier frequency of the intermediate frequency signal is less than or equal to 20 MHz. The carrier frequency of the intermediate frequency signal is greater than zero hertz in this case.

In a further advantageous embodiment of the present invention, the digital demodulator unit has a bandpass filter with a downstream digital demodulator. This bandpass filter fulfills the task of suppressing higher harmonics of the useful signal.

The bandpass filter can advantageously be implemented as a polyphase filter.

In a preferred embodiment of the present invention, the digital demodulator is a quadricorrelator.

In an alternative, advantageous embodiment of the present invention, the digital demodulator unit has a digital mixer stage with a downstream lowpass filter and digital demodulator. The digital mixer fulfills the task in this case by mixing the input signal with the center frequency of its carrier frequency in order to remove the carrier frequency of the input signal. Consequently, the input signal present in the I and Q components has a carrier frequency of 0 Hz at the output of the digital demodulator unit. The lowpass filter can have a device for reducing the clock-pulse rate of the signal to be filtered.

Other features which are considered as characteristic for the invention are set forth in the appended claims.

Although the invention is illustrated and described herein as embodied in a receiver circuit, in particular for a mobile radio, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a block diagram showing the architecture of an exemplary inventive receiver circuit;

FIG. 2 is a block diagram of a first exemplary embodiment of the digital demodulator shown in FIG. 1; and FIG. 3 is a block diagram of a second exemplary embodiment of the digital demodulator shown in FIG. 1.

DESCRIPTION OF THE PREFERRED EMBODIMENTS

Referring now to the figures of the drawing in detail and first, particularly, to FIG. 1 thereof, there is shown a radio receiver with a first mixer stage AM having a first input being fed with a radio-frequency received signal RF that is to be demodulated, and to a second input being fed with a complex carrier signal S1. The radio-frequency received signal RF is coupled in this case into an antenna ANT and is amplified in a low-noise preamplifier LNA before being fed to the first mixer stage AM. The complex carrier signal S1 has a cosinusoidal component and a sinusoidal component that is phase-shifted by 90° relative thereto which are fed to the first mixer stage in such a way as to produce at the output an intermediate frequency signal I, Q that has a low intermediate frequency. Connected to the output of the first mixer stage AM, which is designed as an analog mixer stage, is a channel filter KF for filtering out undesired image frequencies. In the further signal processing, the channel filter KF is followed by a limiting amplifier LIM in a limiter stage. This amplifier amplifies and limits the intermediate frequency signal I, Q in such a way that the intermediate frequency signal I, Q is present at its output in a discrete-value fashion, but still continuously in time. A sampling unit AE can be used to convert the complex, discrete-value intermediate frequency signal into a discrete-value and discrete-time signal by using a sampling frequency SF. The latter signal can be demodulated in a digital demodulator unit DE downstream of the sampling device such that the input signal is present in demodulated form at the output of the demodulator unit DE.

The channel filter KF, limiting amplifier LIM, sampling device AE and digital demodulator unit DE are designed in this case for the purpose of processing a complex intermediate frequency signal I, Q, and together form a complex processing unit KB.

Alternative design possibilities for implementing the demodulator unit DE are specified by way of example in FIGS. 2 and 3.

In the digital demodulator unit DE shown in FIG. 2, a bandpass filter BP and a digital demodulator DD1 are connected downstream of the sampling unit AE in order to sample the discrete-value, but continuous-time intermediate frequency signal. The bandpass filter BP is suitable in this case for processing signals present in quadrature components at its input and at its output. The bandpass filter BP, in particular, filters out higher harmonics that occur from sampling the signal in the sampling device AE. The digital demodulator DD1, therefore has two inputs for being fed with the quadrature components of the sampled and filtered intermediate frequency signal. The digital demodulator DD1 is implemented as a quadricorrelator. The demodulated signal, which is present in digital form in the discrete-time and discrete-value fashion, can be derived at the output of the quadricorrelator.

FIG. 3 shows a further exemplary embodiment for implementing the digital demodulator unit DE. In this case, a digital mixer DM is connected downstream of the sampling device AE, which samples, at a sampling frequency SF, the intermediate frequency signal present in a fashion decomposed into quadrature components. At its second input, the digital mixer DM can be fed a second carrier signal S2, whose frequency is set in each case such that it corresponds to the center frequency of the carrier frequency of the intermediate frequency signal such that a baseband signal whose carrier frequency is 0 Hz is present at the output of the digital mixer DM. The second carrier signal S2 and the signal that can be derived at the output of the digital mixer in each case have an inphase component and a quadrature component. Whereas the bandpass filter BP in accordance with FIG. 2 is implemented as a complex filter, for example, as a polyphase filter, the lowpass filter in accordance with FIG. 3 need not be implemented in a complex fashion. The lowpass filter TP serves, in particular, to suppress undesired signals that are caused by the sampling unit AE and the digital mixer DM. In addition to the task of lowpass filtering, the lowpass filter TP, which is implemented digitally, has the property that it reduces the clock-pulse rate of the signal (decimation). Connected downstream of the lowpass filter is a digital demodulator DD2 with two inputs for feeding a complex signal, and with one output, at which the demodulated discrete-time and discrete-value input signal is present.

The described exemplary embodiments in accordance with FIGS. 1 to 3 can be implemented with a low chip area requirement in a simple way and with a high degree of integration. Moreover, they can be operated with a low power consumption and have a high accuracy and a high sensitivity.

We claim:

1. A receiver circuit for demodulating a radio-frequency signal, comprising:
    a first mixer stage having a first input, a second input, and an output, said first input for obtaining a radio-frequency signal to be demodulated, said second input for obtaining a complex-value carrier signal, said output for providing a complex-valued intermediate frequency signal;
    a limiting amplifier connected to said output of said first mixer stage, said limiting amplifier having an output for providing a discrete-value signal derived from the intermediate frequency signal;
    a sampling device connected to said output of said limiting amplifier;
    a channel filter designed as a polyphase filter configured between said first mixer stage and said limiting amplifier; and
    a digital demodulator unit connected downstream of said sampling device, said demodulator unit having an output for providing a demodulated signal.

2. The receiver circuit according to claim 1, wherein the intermediate frequency signal has a frequency of less than or equal to 20 MHz.

3. The receiver circuit according to claim 2, wherein said digital demodulator unit has a bandpass filter and a digital demodulator connected downstream from said bandpass filter.

4. The receiver circuit according to claim 1, wherein said digital demodulator unit has a bandpass filter and a digital demodulator connected downstream from said bandpass filter.

5. The receiver circuit according to claim 4, wherein said bandpass filter is a polyphase filter.

6. The receiver circuit according to claim 5, wherein said digital demodulator is a quadricorrelator.

7. The receiver circuit according to claim 4, wherein said digital demodulator is a quadricorrelator.

8. The receiver circuit according to claim 1, wherein:
    said digital demodulator unit has a digital mixer stage, a lowpass filter, and digital demodulator; and
    said lowpass filter and said digital demodulator are connected downstream from said digital mixer stage.

9. The receiver circuit according to claim 1, wherein:
    said digital demodulator unit has a digital mixer stage, a lowpass filter, and digital demodulator;
    said lowpass filter and said digital demodulator are connected downstream from said digital mixer stage; and
    the intermediate frequency signal has a frequency of less than or equal to 20 MHz.

10. The receiver circuit according to claim 1, further comprising a low-noise preamplifier for connecting said first input of said first mixer stage to an antenna.

11. A receiver circuit for being implemented in a mobile radio and for demodulating a radio-frequency signal, comprising:
    a first mixer stage having a first input, a second input, and an output, said first input for obtaining a radio-frequency signal to be demodulated, said second input for obtaining a complex-value carrier signal, said output for providing a complex-valued intermediate frequency signal;
    a limiting amplifier connected to said output of said first mixer stage, said limiting amplifier having an output for providing a discrete-value signal derived from the intermediate frequency signal;
    a sampling device connected to said output of said limiting amplifier;
    a channel filter designed as a polyphase filter configured between said first mixer stage and said limiting amplifier; and
    a digital demodulator unit connected downstream of said sampling device, said demodulator unit having an output for providing a demodulated signal.

* * * * *